(12) United States Patent
Sui et al.

(10) Patent No.: US 12,081,197 B2
(45) Date of Patent: Sep. 3, 2024

(54) FILM BULK ACOUSTIC RESONATOR AND FABRICATION METHOD THEREOF, FILTER, AND RADIO FREQUENCY COMMUNICATION SYSTEM

(71) Applicant: Ningbo Semiconductor International Corporation, Ningbo (CN)

(72) Inventors: Huan Sui, Ningbo (CN); Fei Qi, Ningbo (CN); Guohuang Yang, Ningbo (CN)

(*) Notice: Subject to any disclaimer, the term of this patent is extended or adjusted under 35 U.S.C. 154(b) by 681 days.

(21) Appl. No.: 17/198,698

(22) Filed: Mar. 11, 2021

(65) Prior Publication Data
US 2021/0281243 A1 Sep. 9, 2021

Related U.S. Application Data

(63) Continuation of application No. PCT/CN2020/099647, filed on Jul. 1, 2020.

(30) Foreign Application Priority Data
Jul. 19, 2019 (CN) .......................... 201910657139.6

(51) Int. Cl.
*H03H 9/56* (2006.01)
*H03H 3/02* (2006.01)
(Continued)

(52) U.S. Cl.
CPC ............... *H03H 9/56* (2013.01); *H03H 3/02* (2013.01); *H03H 9/0504* (2013.01); *H03H 9/13* (2013.01); *H03H 9/17* (2013.01)

(58) Field of Classification Search
CPC .......... H03H 9/56; H03H 3/02; H03H 9/0504; H03H 9/13; H03H 9/17; H03H 2003/023;
(Continued)

(56) References Cited

U.S. PATENT DOCUMENTS

| 5,481,154 A | 1/1996 | Kaida |
| 2018/0048281 A1 | 2/2018 | Lee et al. |
| 2019/0334503 A1* | 10/2019 | Wang ........................ H03H 3/02 |

FOREIGN PATENT DOCUMENTS

| CN | 103873010 A | 6/2014 |
| CN | 104038177 A | 9/2014 |

(Continued)

*Primary Examiner* — Rakesh B Patel
*Assistant Examiner* — Jorge L Salazar, Jr.

(57) ABSTRACT

The present disclosure provides a film bulk acoustic resonator and its fabrication method, a filter, and a radio frequency communication system. The film bulk acoustic resonator includes a first substrate and a support layer disposed on the first substrate, where a cavity is formed in the support layer; a piezoelectric stacked layer covering the cavity, where the piezoelectric stacked layer includes an active resonance region and an inactive resonance region surrounding the active resonance region; and at least two trenches, arranged at a junction of the active resonance region and the inactive resonance region to define a range of the active resonance region. The at least two trenches include a first trench and a second trench; the second trench passes through the second electrode layer and the piezoelectric layer; and the first trench passes the first electrode and the piezoelectric layer and is connected to the cavity.

18 Claims, 8 Drawing Sheets

(51) Int. Cl.
*H03H 9/05* (2006.01)
*H03H 9/13* (2006.01)
*H03H 9/17* (2006.01)

(58) Field of Classification Search
CPC .............. H03H 9/174; H03H 9/02118; H03H 9/02015; H03H 9/02047; H03H 9/131; H03H 9/132
USPC ................................................. 333/187, 188
See application file for complete search history.

(56) References Cited

FOREIGN PATENT DOCUMENTS

| | | |
|---|---|---|
| CN | 107809221 A | 3/2018 |
| CN | 109309483 A | 2/2019 |
| CN | 109831172 A | 5/2019 |
| GB | 2282260 A | 3/1995 |
| JP | H07147527 A | 6/1995 |
| JP | H08267764 A | 10/1996 |
| JP | 2008147833 A | 6/2008 |
| JP | 2015198450 A | 11/2015 |

\* cited by examiner

FILM BULK ACOUSTIC RESONATOR AND FABRICATION METHOD THEREOF, FILTER, AND RADIO FREQUENCY COMMUNICATION SYSTEM

CROSS-REFERENCE TO RELATED APPLICATIONS

This application is a continuation application of PCT Patent Application No. PCT/CN2020/099647, filed on Jul. 1, 2020, which claims priority to Chinese patent application No. 201910657139.6, filed on Jul. 19, 2019, the entirety of all of which is incorporated herein by reference.

FIELD OF THE DISCLOSURE

The present disclosure generally relates to the field of semiconductor device manufacturing, and more particularly, relates to a film bulk acoustic resonator and its fabrication method, a filter, and a radio frequency communication system.

BACKGROUND

Since the analog radio frequency (RF) communication technology is developed in the early 1990, RF front-end modules have gradually become the core components of communication devices. Among all RF front-end modules, the filters have become the components with the most promising growth momentum and development potential. With the rapid development of wireless communication technology, the 5G communication protocol has been developed more maturely, and the market has also put forward more stringent standards for the performance of RF filters in all aspects. The performance of the filters is determined by the resonator units which are used to form the filters. Among the existing filters, the film bulk acoustic resonator (FBAR) has become one of the most suitable filters for 5G applications because of its characteristics, including small size, low insertion loss, large out-of-band suppression, high quality factor, high operating frequency, large power capacity, desirable resistance to electrostatic shock, and the like.

The film bulk acoustic resonator includes two film electrodes, and a piezoelectric film layer is arranged between the two film electrodes. The FBAR working principle is described as the following. The piezoelectric film layer is used to generate vibration under an alternating electric field; the vibration excites the bulk acoustic wave propagating along the thickness direction of the piezoelectric film layer; such acoustic wave may be reflected back from the interface between the air and each of the two film electrodes, and then be reflected back and forth inside the film layer to form an oscillation. When the acoustic wave propagates in the piezoelectric film layer having exactly an odd multiple of the half wavelength, a standing wave oscillation is formed.

BRIEF SUMMARY OF THE DISCLOSURE

One aspect of the present disclosure provides a film bulk acoustic resonator. The film bulk acoustic resonator includes:
a first substrate and a support layer disposed on the first substrate, where a cavity is formed in the support layer;
a piezoelectric stacked layer covering the cavity, where the piezoelectric stacked layer includes a first electrode, a piezoelectric layer, and a second electrode which are sequentially disposed on the support layer, and the piezoelectric stacked layer includes an active resonance region above a center of the cavity and an inactive resonance region surrounding the active resonance region; and
at least two trenches, arranged at a junction of the active resonance region and the inactive resonance region to define a range of the active resonance region, where the at least two trenches include a first trench and a second trench; the second trench passes through the second electrode layer and the piezoelectric layer; and the first trench passes the first electrode and the piezoelectric layer and is connected to the cavity.

Another aspect of the present disclosure provides a filter, where the filter includes at least one film bulk acoustic resonator.

Another aspect of the present disclosure provides a radio frequency communication system, where the radio frequency communication system includes at least one filter.

Another aspect of the present disclosure provides a method for fabricating a film bulk acoustic resonator. The method includes:
providing a second substrate and forming a piezoelectric stacked layer-structure on the second substrate, where the piezoelectric stacked layer-structure includes a second electrode layer, a piezoelectric layer, and a first electrode layer which are sequentially formed on the second substrate;
forming a support layer on the first electrode layer, where an opening is formed in the support layer, exposing a portion of the first electrode layer;
etching the first electrode layer and the piezoelectric layer to form at least one first trench connected to the opening;
providing a first substrate, and bonding the first substrate with the support layer to seal the opening, forming a cavity;
removing the second substrate; and
etching the second electrode layer and the piezoelectric layer to form at least one second trench, where projections of the first trench and the second trench on a plane of the piezoelectric layer enclose an active resonance region.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in the embodiments of the present disclosure or the existing technology, the drawings that need to be used in the description of the embodiments or the existing technology are illustrated hereinafter. Obviously, the drawings in the following description are merely some embodiments of the present disclosure. For those skilled in the art, other drawings can be obtained based on such drawings without creative work.

DETAILED DESCRIPTION

The present disclosure provides a film bulk acoustic resonator and its fabrication method, a filter, and a radio frequency communication system.

Figure 1:
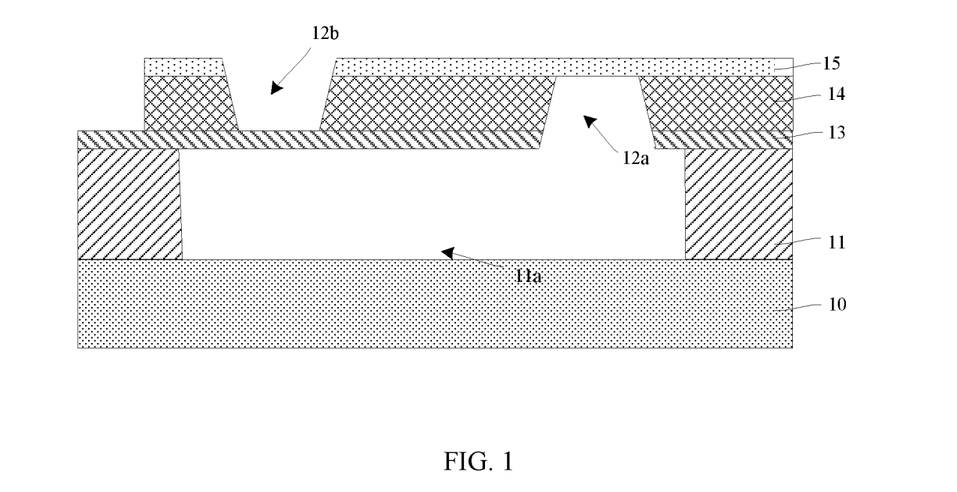
FIG. 1 illustrates a cross-sectional structural schematic of a film bulk acoustic resonator having a trench structure according to various embodiments of the present disclosure.

FIG. 1 illustrates a cross-sectional structural schematic of a film bulk acoustic resonator having a trench structure according to various embodiments of the present disclosure. The film bulk acoustic resonator shown in FIG. 1 may include a substrate 10 and a support layer 11 disposed on the substrate 10, where a cavity 11a with a top opening is disposed in the support layer 11; and a piezoelectric stacked layer having two trenches which is disposed by covering the cavity 11a. The trenches include a first trench 12a and a second trench 12b; the second trench 12b passes through the second electrode 15 and the piezoelectric layer 14; and the first trench 12a, connected to the cavity 11a, passes through the first electrode 13 and the piezoelectric layer 14.

In the film bulk acoustic resonator provided by the present disclosure, the piezoelectric stacked layer is disposed with at least one first trench and at least one second trench; and the projections of the first trench and the second trench on the plane where the piezoelectric layer is located encloses an active resonance region of the film bulk acoustic resonator. In the present disclosure, the first trench and the second trench may effectively block the propagation of transverse waves in an inactive resonance region and improve the acoustic wave loss, thereby improving the quality factor of the film bulk acoustic resonator and further improving the performance of the device.

The film bulk acoustic resonator and its fabrication method of film bulk acoustic resonator in the present disclosure may be further described in detail with reference to the accompanying drawings and specific embodiments hereinafter. The advantages and features of the present disclosure may be more apparent according to the following description and the accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of the embodiments of the present disclosure.

The terms "first", "second" and the like in the specification and the claims may be used to distinguish similar elements and may be not necessarily used to describe a particular order or chronological order. It should be understood that the used terms may be substituted, as appropriate. For example, the embodiments described herein of the present disclosure may be enabled to operate in other sequences than sequences described or illustrated herein. Similarly, if the method described herein comprise a series of steps, the order of the steps presented herein may not be necessarily the only order in which the steps may be performed, and some of the steps may be omitted and/or other steps, which are not described herein, may be added to the method. If components in one of the drawings are same as components in other drawings, although the components may be easily recognized in all drawings, in order to make the description of the drawings clearer, labels of all the same components may not be marked in each figure in the present specification.

Figure 2A:
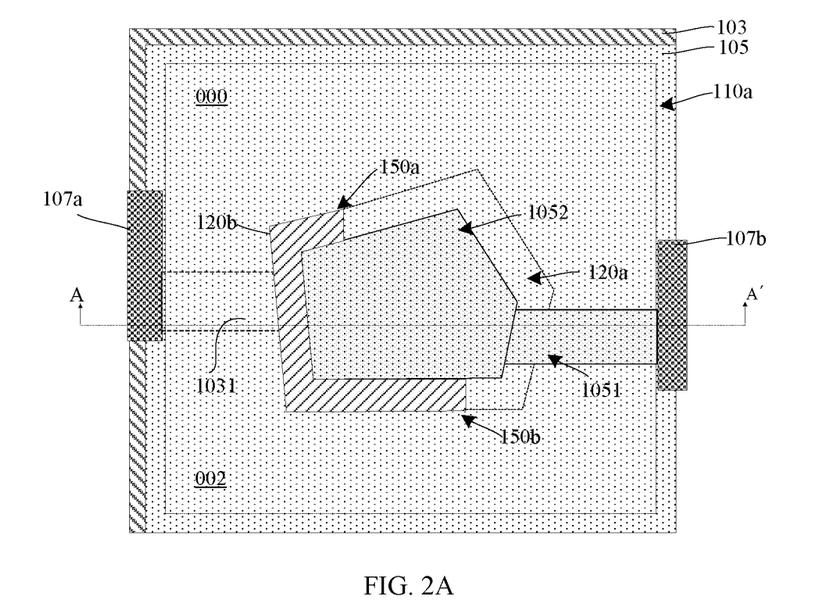
FIG. 2A illustrates a top view of a film bulk acoustic resonator with a first continuous trench and a second continuous trench according to various embodiments of the present disclosure.
Figure 2B:
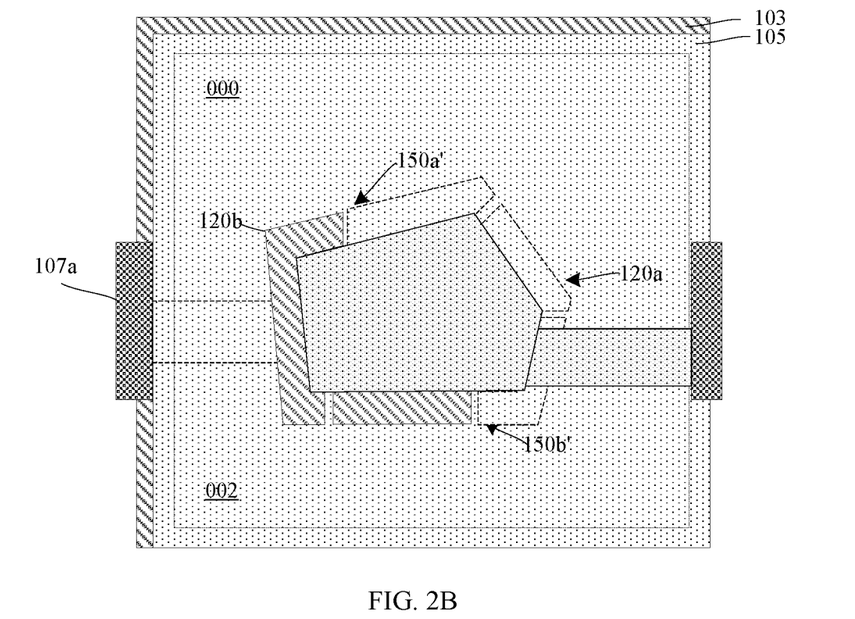
FIG. 2B illustrates a top view of another film bulk acoustic resonator with a plurality of discrete first trenches and a plurality of discrete second trenches according to various embodiments of the present disclosure.
Figure 2C:
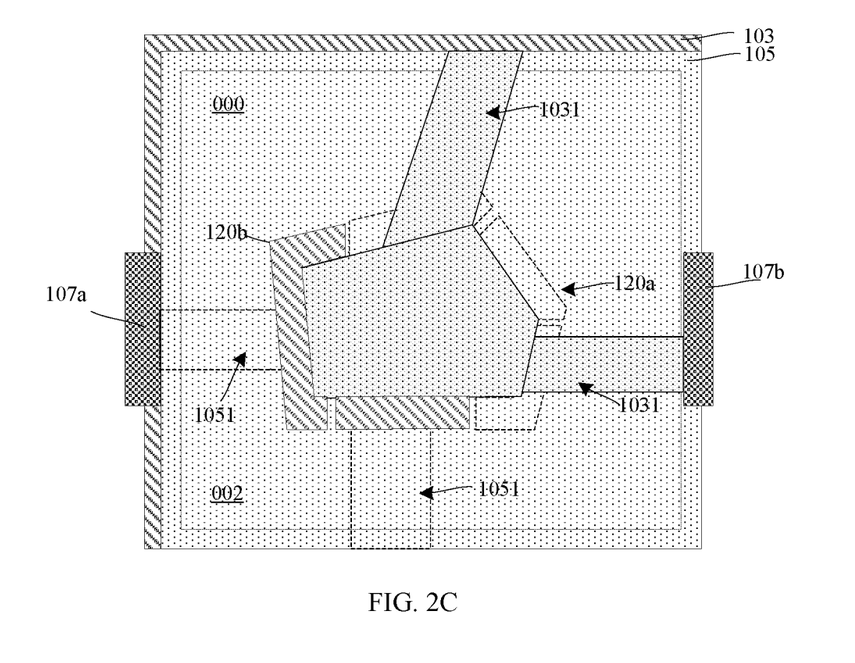
FIG. 2C illustrates a top view of a film bulk acoustic resonator with a formed multi-bridge structure electrode adjoining region according to various embodiments of the present disclosure.
Figure 2D:
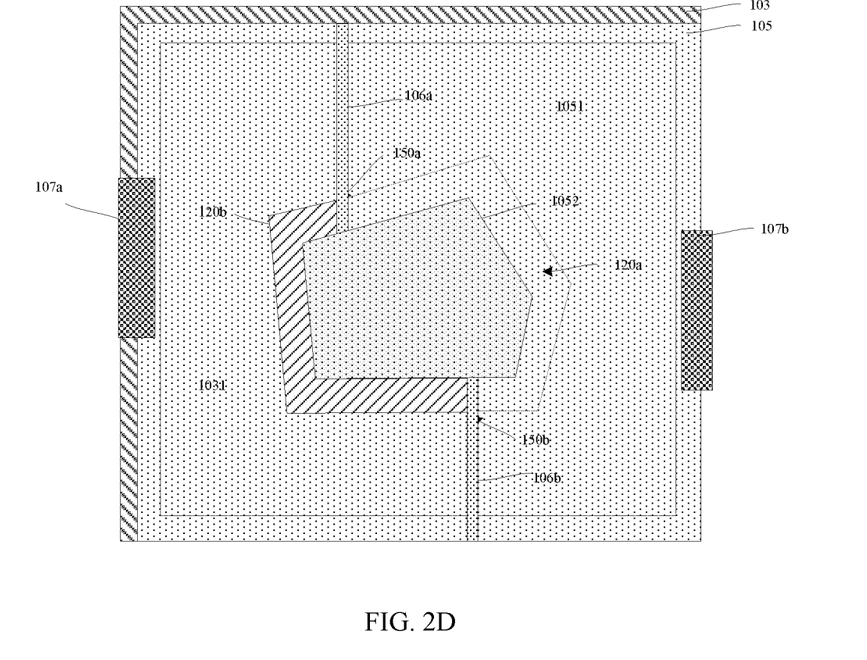
FIG. 2D illustrates a top view of a film bulk acoustic resonator with a formed mesh electrode adjoining region according to various embodiments of the present disclosure.
Figure 3:
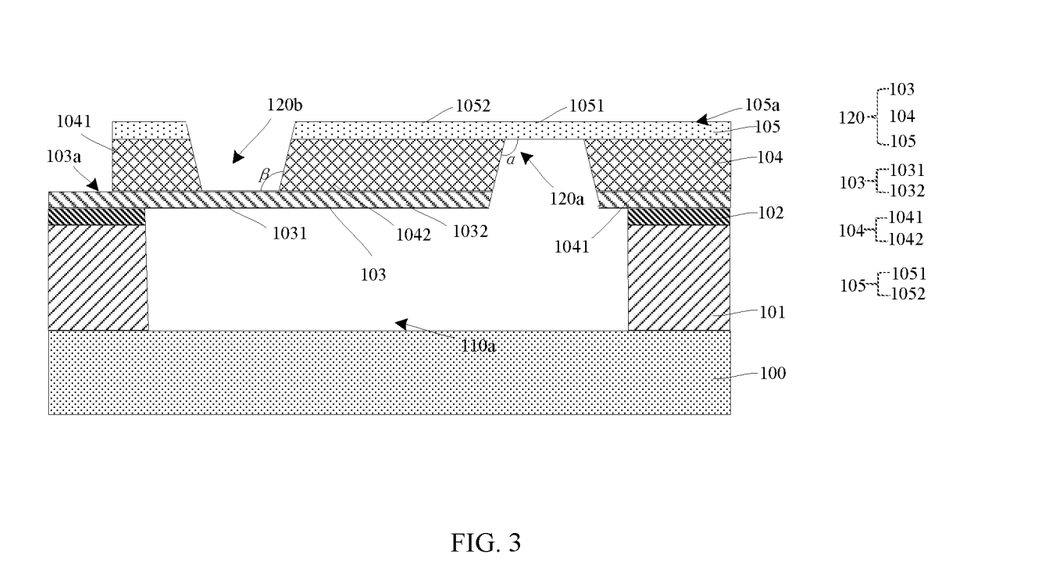
FIG. 3 illustrates a cross-sectional structural schematic along an AA' line in FIG. 2A.

FIG. 2A illustrates a top view of a film bulk acoustic resonator with a first continuous trench and a second continuous trench according to various embodiments of the present disclosure. FIG. 2B illustrates a top view of another film bulk acoustic resonator with a plurality of discrete first trenches and a plurality of discrete second trenches according to various embodiments of the present disclosure. FIG. 2C illustrates a top view of a film bulk acoustic resonator with a formed multi-bridge structure electrode adjoining region according to various embodiments of the present disclosure. FIG. 2D illustrates a top view of a film bulk acoustic resonator with a formed mesh electrode adjoining region according to various embodiments of the present disclosure. FIG. 3 illustrates a cross-sectional structural schematic along an AA' line in FIG. 2A.

Referring to FIG. 2A and FIG. 3, the film bulk acoustic resonator in one embodiment may include:

a first substrate 100 and a support layer 101 disposed on the first substrate, where a cavity 110a with a top opening is disposed in the support layer 101;

a piezoelectric stacked layer 120 disposed by covering the cavity 110a, where the piezoelectric stacked layer 120 includes a first electrode 103, a piezoelectric layer 104, and a second electrode 105 which are sequentially disposed on the support layer 101, and includes an active resonance region 001 located above the center of the cavity 110a and an inactive resonance region 002 surrounding the active resonance region 001; and two trenches, arranged at the junction of the active resonance region 001 and the inactive resonance region 002 to define the range of the active resonance region 001, where the trenches include a first trench 120a and a second trench 120b; the second trench 120b passes through the second electrode 105 and the piezoelectric layer 104; and the first trench 120a, connected to the cavity 110a, passes the first electrode 103 and the piezoelectric layer 101.

In one embodiment, the first substrate 100 may be any suitable substrate known to those skilled in the art. For example, the first substrate 100 may be made of a material including at least one of the materials mentioned below: silicon (Si), germanium (Ge), silicon germanium (SiGe), silicon carbon (SiC), silicon germanium (SiGeC), indium arsenide (InAs), Gallium arsenide (GaAs), indium phosphide (InP) or other III/V compound semiconductors; a multilayer-structure composed of such semiconductors; silicon-on-insulator (SOI), silicon-on-insulator (SSOI), silicon-germanium-on-insulator (S—SiGeOI), silicon germanium-on-insulator (SiGeOI), and germanium-on-insulator (GeOI); and a double side polished wafer (DSP), a ceramic substrate such as alumina, a quartz or glass substrate, and/or the combination thereof.

In one embodiment, the material of the first substrate 100 may be a P-type high resistance single crystal silicon wafer with a <100> crystal orientation.

The support layer 101 may be made of any suitable dielectric material which includes, but is not limited to, at least one of silicon oxide, silicon nitride, silicon oxynitride, silicon carbonitride, and the like.

The support layer 101 may be located on the first substrate 100, and the support layer 101 may be disposed with the cavity 110a. The cavity 110a may be formed by etching the support layer 101 through an etching process, which may not limit the technology of the present disclosure. In one embodiment, the shape of the bottom surface of the cavity 110a may be rectangular. However, in other embodiments of the present disclosure, the shape of the bottom surface of the cavity 110a may also be a circle, an ellipse, or a polygon other than a rectangle, such as a pentagon, a hexagon, and the like.

The piezoelectric stacked layer 120 may include the first electrode 103, the piezoelectric layer 104, and the second electrode 105. The first electrode 103 may be on the support layer 101; and the second electrode 105 may be disposed opposite to the first electrode 103. The piezoelectric layer 104 may be between the first electrode 103 and the second electrode 105; and the overlapped region of the first electrode 103, the piezoelectric layer 104, and the second electrode 105 along the thickness direction may be directly above the cavity 110a.

An etch stop layer 102 may be also disposed between the support layer 101 and the first electrode 103; and the material of the etch stop layer 102 may include, but may not be limited to, silicon nitride ($Si_3N_4$), silicon oxynitride (SiON), or any other suitable material(s).

On the one hand, the etch stop layer 102 may be used to increase the structural stability of the finally fabricated film bulk acoustic resonator; on the other hand, the etch stop layer 102 may have a lower etch rate than the support layer 101, which may prevent over-etching during the process of etching the support layer 101 to form the cavity 110a and protect the surface of the first electrode under the etch stop layer 102 from being damaged, thereby improving the device performance and reliability. It should be noted that the first electrode 103 may include an edge region 103a that is not covered by the piezoelectric layer 104 and the second electrode 105, thereby facilitating subsequent input/output of electrical signals.

The first trench 120a and the second trench 120b, which are also called air trenches, may be disposed in the piezoelectric stacked layer 120. The first trench 120a may pass through the first electrode 103 and the piezoelectric layer 104 and be connected to the cavity 110a; and the second trench 120b may pass through the second electrode 105 and the piezoelectric layer 104.

Referring to FIG. 2A, the projections of the first trench 120a and the second trench 120b on the plane where the piezoelectric layer 104 is located may be semi-circular or semi-circular-like polygons; and the projections of the first trench 120a and the second trench 120b on the plane where the piezoelectric layer 104 is located may be exactly connected or close to be connected. That is, the projections of the first trench 120a and the second trench 120b on the plane where the piezoelectric layer 104 is located may form a completely closed ring or an approximately closed ring. The junctions of the projections of the first trench 120a and the second trench 120b on the plane where the piezoelectric layer 104 is located may include a first junction 150a and a second junction 150b. The first trench 120a and the second trench 120b may cooperate to block transverse waves around a piezoelectric resonance region 1042. That is, the region, where the shape (circle or polygon) formed by the projections of the first trench 120a and the second trench 120b on the plane where the piezoelectric layer 104 is located, may be the effective resonance region 001 of the film bulk acoustic resonator. The first trench 120a and the second trench 120b may be located at the periphery of the effective resonance region 001. The ring formed by combining two projections of the first trench 120a and the second trench 120b on the plane where the piezoelectric layer 104 is located may be equally divided (at this point, the first trench 120a and the second trench 120b are separated on two sides of the effective resonance region 001 and all portions are completely opposite), and may be unevenly divided (at this point, the first trench 120a and the second trench 120b are separated on two sides of the effective resonance region 001 and only some portions are opposite).

Moreover, the cross sections of the first trench 120a and the second trench 120b along the line AA' in FIG. 2A may be trapezoidal or trapezoid-like. That is, the angle α between the sidewall of the first trench 120a and the plane where the second electrode 105 is located, and the angle R between the sidewall of the second trench 120b and the plane where the first electrode 103 is located are obtuse angles, where a and p are greater than 90 degrees and less than 160 degrees.

In one embodiment, the shape (the effective resonance region 001) formed by the projections of the first trench 120a and the second trench 120b on the plane where the piezoelectric layer 104 is located is a pentagon where the projections of the first trench 120a and the second trench 120b are exactly connected with each other; and any two sides of the polygon are not in parallel with each other. In other embodiments of the present disclosure, as shown in FIG. 2B, there may be a plurality of first trenches 120a and second trenches 120b, and the shape formed by the projections of the plurality of first trenches 120a and the plurality of second trenches 120b on the plane where the piezoelectric layer 104 is located may be a discontinuous nearly-closed pentagon.

In one embodiment, the support layer 101 and the first substrate 100 may be bonded together by a thermocompression bonding process or a dry film bonding process.

In the piezoelectric stacked layer 120, the first electrode 103 may include a first electrode adjoining region 1031 and a first electrode resonance region 1032; the first electrode resonance region 1032 may overlap the active resonance region 001; and the first electrode adjoining region 1031 may be connected to each of the first electrode resonance region 1032 and the support layer 101. The second electrode 105 may include a second electrode adjoining region 1051 and a second electrode resonance region 1052; the second electrode resonance region 1052 may overlap the active resonance region 001; the second electrode adjoining region 1051 may be connected to each of the second electrode resonance region 1052 and the piezoelectric stacked layer on the periphery of the cavity. The second electrode adjoining region 1051 may not overlap the first electrode adjoining region 1031 above the cavity 110a, thereby avoiding parasitic resonance above the cavity 110a outside the active resonance region 001. In one embodiment and another embodiment, referring to FIGS. 2A-2B, the second electrode adjoining region 1051 and the first electrode adjoining region 1031 may each be patterned into a bridge structure with one end connected to only one edge of the resonator, which may ensure that the second electrode adjoining region 1051 and the first electrode adjoining region 1031 do not overlap above the cavity 110a, and avoid parasitic resonance in the inactive resonance region 002 above the cavity 110a.

In other embodiments, as shown in FIG. 2C, at least one of the second electrode adjoining region 1051 and the first electrode adjoining region 1031 may also be patterned into a multi-bridge structure with ends connected to multiple edges of the resonator. For example, the first electrode adjoining region 1031 may be patterned into a multi-bridge structure, and the second electrode adjoining region 1051 and the multi-bridge structure of the first electrode adjoining region 1031 may not overlap above the cavity 100a. The multi-bridge structure may strengthen the support for the piezoelectric stacked layer 120, thereby increasing the mechanical strength of the resonator.

Furthermore, in another embodiment, referring to FIG. 2D, at least one of the second electrode adjoining region 1051 and the first electrode adjoining region 1031 may also be patterned as a planar structure with one end connected to multiple edges of the resonator; and the second electrode adjoining region 1051 and the first electrode adjoining region 1031 may not overlap above the cavity 10a, which may further increase the mechanical strength of the resonator. In specific implementation, a first electrode layer 103' can be etched to form a first opening 106a and a second opening 106b with a certain line width along the junctions of the first trench 120a and the second trench 120b (the first junction 150a, and the second junction 150b). The first opening 106a and the second opening 106b may pass through the first electrode layer 103' and respectively extend from the first junction 150a and the second junction 150b (connected to the second trench 120b) to outside the boundary of the first electrode layer. Similarly, at positions corresponding to the first opening 106a and the second opening 106b in a second electrode layer 150', two same openings (not shown) may also be etched. In such way, it can be realized that the second electrode adjoining region 1051 and the first electrode adjoining region 1031 may not overlap above the cavity 110a, and the parasitic resonance of the inactive resonance region 002 above the cavity 110a may be avoided. In other embodiments, the first opening 106a and the second opening 106b may also pass through the first electrode layer 103', the piezoelectric layer 104, and the second electrode layer 105' to achieve a same electrode separation effect, thereby avoiding parasitic resonance in the inactive resonance region 002 above the cavity 110a.

Referring to FIG. 2A and FIG. 3, the piezoelectric layer 104 may include a piezoelectric mounting region 1041 and a piezoelectric resonance region 1042. The piezoelectric resonance region 1042 may be located between the first electrode resonance region 1032 and the second electrode resonance region 1052, that is, the piezoelectric resonance region 1042 may overlap the active resonance region 001; the piezoelectric mounting region 1041 may be connected to the edge of the resonator; and the piezoelectric mounting region 1041 and the piezoelectric resonance region 1042 may be completely separated by the first trench 120a and the second trench 120b. The second trench 120b may be located above the first electrode adjoining region 1031, and the first trench 120a may be located below the second electrode adjoining region 1051. In other embodiments, referring to FIGS. 2B-2C, the first trench 120a and the second trench 120b are the plurality of discrete trenches, such that the piezoelectric mounting region 1041 and the piezoelectric resonance region 1042 may be connected at spacings between the plurality of first trenches 120a and the plurality of second trenches 120b.

In other embodiments of the present disclosure, the film bulk acoustic resonator may further include signal input/output structures. For example, the signal input/output structures may a first soldering pad 107a and a second soldering pad 107b which are connected to the first electrode 103 and the second electrode 105, respectively. For example, the first soldering pad 107a may be connected to the edge region 103a of the first electrode 103 which is not covered by the piezoelectric layer 104 and the second electrode 105; and the second soldering pad 107b may be connected to an edge region 105a of the second electrode 105, as shown in FIG. 3.

The embodiments of the present disclosure also provide a filter including at least one above-mentioned film bulk acoustic resonator according to any embodiments of the present disclosure.

The embodiments of the present disclosure also provide a radio frequency communication system including at least one filter according to the embodiments of the present disclosure.

Figure 4:
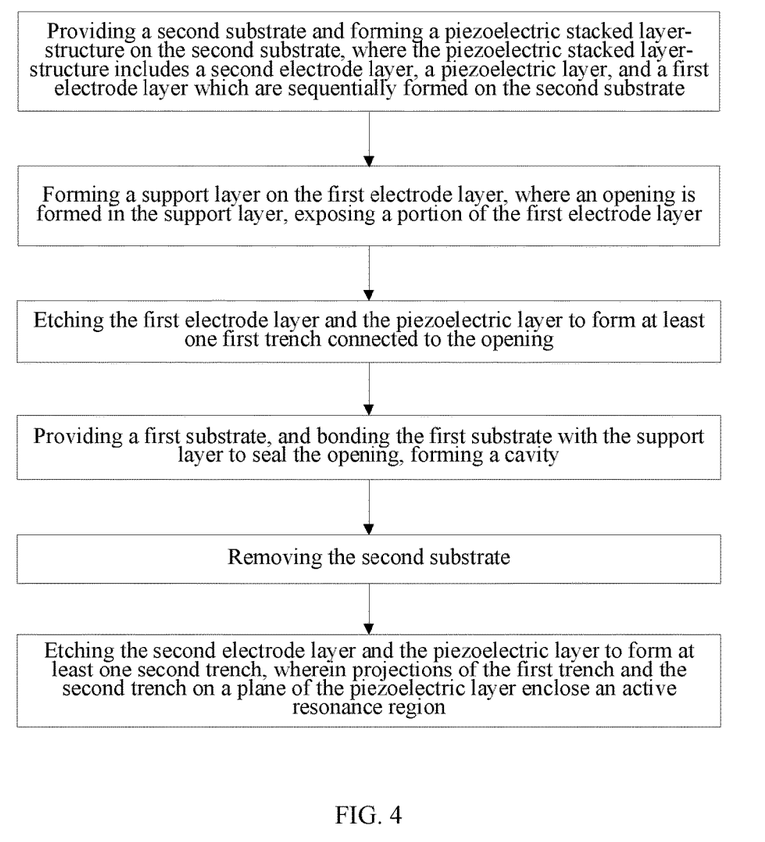
FIG. 4 illustrates a flowchart of a fabrication method of a film bulk acoustic resonator according to various embodiments of the present disclosure.

The embodiments of the present disclosure further provide a fabrication method of a film bulk acoustic resonator. Referring to FIG. 4, FIG. 4 illustrates a flowchart of the fabrication method of the film bulk acoustic resonator according to various embodiments of the present disclosure. The fabrication method of the film bulk acoustic resonator may include:

S01, providing a second substrate 200 and forming a piezoelectric stacked layer-structure on the second substrate 200, where the piezoelectric stacked layer-structure may include the second electrode layer 105', the piezoelectric layer 104, and the first electrode layer 103' which are sequentially formed on the second substrate 200;

S02, forming a support layer on the first electrode layer 103'; forming an opening in the support layer to expose a portion of the first electrode layer 103'; and etching the first electrode layer 103' and the piezoelectric layer to form at least one first trench which is connected to the opening;

S03, providing a first substrate, and bonding the first substrate to the support layer to form a cavity at the opening;

S04, removing the second substrate 200; and

S05, etching the second electrode layer 105' and the piezoelectric layer to form at least one second trench, where the projections of the first trench and the second trench on the plane where the piezoelectric layer is located enclose an active resonance region.

FIGS. 5-13 illustrate structural schematics corresponding to certain stages of the fabrication method of the film bulk acoustic resonator according to various embodiments of the present disclosure. The fabrication method of the film bulk acoustic resonator provided in one embodiment is described in detail with reference to FIG. 2A and FIGS. 5-13 hereinafter.

Figure 5:
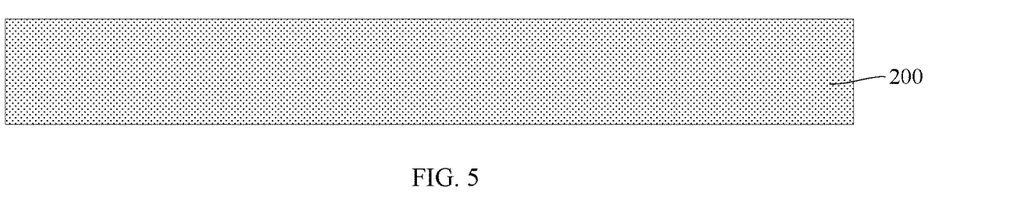
FIGS. 5-13 illustrate structural schematics corresponding to certain stages of a fabrication method of a film bulk acoustic resonator according to various embodiments of the present disclosure.
Figure 6:
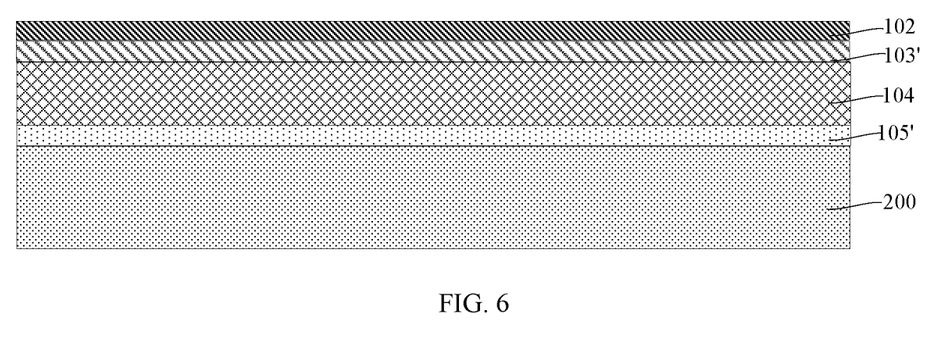

Referring to FIGS. 5-6, step S01 may be performed to provide the second substrate 200 and form the piezoelectric stacked layer-structure on the second substrate 200. The piezoelectric stacked layer-structure may include the second electrode layer 105', the piezoelectric layer 104 and the first electrode layer 103', where the piezoelectric layer 104 may be located between the first electrode layer 103' and the second electrode layer 105'; and the first electrode layer 103' and the second electrode layer 105' may be disposed oppositely. The first electrode 103 may be used as an input electrode or an output electrode which receives or provides an electrical signal such as a radio frequency (RF) signal. For example, when the second electrode 105 is used as the input electrode, the first electrode 103 may be used as the output electrode; when the second electrode 105 is used as the output electrode, the first electrode 103 may be used as the input electrode; and the piezoelectric layer 104 may convert the electrical signal inputted through the first electrode 103 or the second electrode 105 into the bulk acoustic wave. For example, the piezoelectric layer 104 may convert the electrical signal into bulk acoustic wave through physical vibration.

An isolation layer (not shown in the FIG. 6) may also be formed between the second substrate 200 and the piezoelectric stacked layer 120 (e.g., the second electrode layer). The isolation layer may be used as a protective layer of the second substrate 200 to avoid the influence of the piezoelectric stacked layer 120 of the film bulk acoustic resonator formed subsequently on the second substrate 200; meanwhile, in the subsequent peeling process, the second substrate 200 may be separated from the piezoelectric stacked layer 120 subsequently formed by etching the isolation layer, which is beneficial for rapidly peeling off the second substrate 200 and improving the fabrication efficiency. The material of the isolation layer includes, but is not limited to, at least one of silicon dioxide ($SiO_2$), silicon nitride ($Si_3N_4$), aluminum oxide ($Al_2O_3$), and aluminum nitride (AlN). The isolation layer may be formed by a process including chemical vapor deposition, magnetron sputtering, evaporation, and the like. In one embodiment, the second substrate 200 may be monocrystalline silicon, for example, a P-type high resistance monocrystalline silicon wafer with a <100> crystal orientation; and the material of the isolation layer may be silicon dioxide ($SiO_2$).

The second electrode layer 105' and the first electrode layer 103' may be made of any suitable conductive materials or semiconductor materials known in the existing technology, where the conductive material may be a metal material with conductive properties, such as one metal or a stacked layer of the following metals including molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd), and the like; and the semiconductor material may be, for example, Si, Ge, SiGe, SiC, SiGeC, and the like. The second electrode layer 105' and the first electrode layer 103' may be formed by a physical vapor deposition process or a chemical vapor deposition process such as magnetron sputtering, evaporation, and the like. The piezoelectric layer 104 may also be called a piezoelectric resonance layer or a piezoelectric resonance region. The material of the piezoelectric layer 104 may be one or a combination of piezoelectric materials with wurtzite crystal structure, including aluminum nitride (AlN), zinc oxide (ZnO), lead zirconate titanate (PZT), lithium niobate ($LiNbO_3$), quartz potassium niobate ($KNbO_3$), lithium tantalate ($LiTaO_3$), and the like. When the piezoelectric layer 104 includes aluminum nitride (AlN), the piezoelectric layer 104 may also include rare earth metals, such as at least one of scandium (Sc), erbium (Er), yttrium (Y), and lanthanum (La). Moreover, when the piezoelectric layer 104 includes aluminum nitride (AlN), the piezoelectric layer 104 may also include transition metals, such as at least one of zirconium (Zr), titanium (Ti), manganese (Mn), and hafnium (Hf). The piezoelectric layer 104 may be deposited by any suitable process known to those skilled in the art, such as chemical vapor deposition, physical vapor deposition, or atomic layer deposition. For example, in one embodiment, the second electrode layer 105' and the first electrode layer 103' may be made of metallic molybdenum (Mo); and the piezoelectric layer 104 may be made of aluminum nitride (AlN).

The shapes of the second electrode layer 105', the piezoelectric layer 104, and the first electrode layer 103' may be same or different. In one embodiment, the shapes and areas of the second electrode layer 105', the piezoelectric layer 104, and the first electrode layer 103' may be same, where the shapes are all polygonal, such as square.

Before forming the second electrode layer 105', a seed layer (not shown in FIG. 6) may be formed on the isolation layer. The seed layer may be formed between the isolation layer and the second electrode layer 105'. The seed layer may guide the crystal orientation of the second electrode layer 105' (the piezoelectric layer 104 and the first electrode layer 103') to be formed subsequently, which is convenient for the piezoelectric stacked layer-structure formed subsequently to grow along a specific crystal orientation, thereby ensuring the uniformity of the piezoelectric layer. The material of the seed layer may be aluminum nitride (AlN), In addition to AlN, the seed layer may also be formed using a metal or dielectric material having a hexagonal close packed (HCP) structure. For example, the seed layer may also be formed of metal titanium (Ti).

Figure 7:
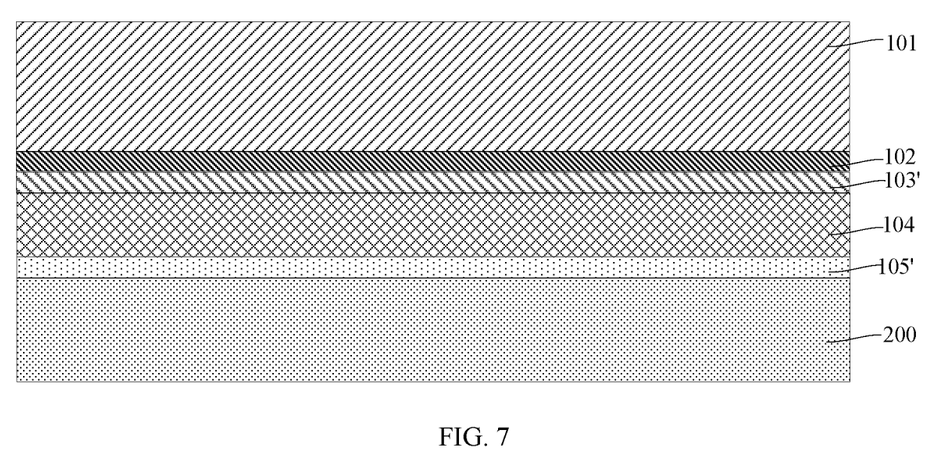
Figure 8:
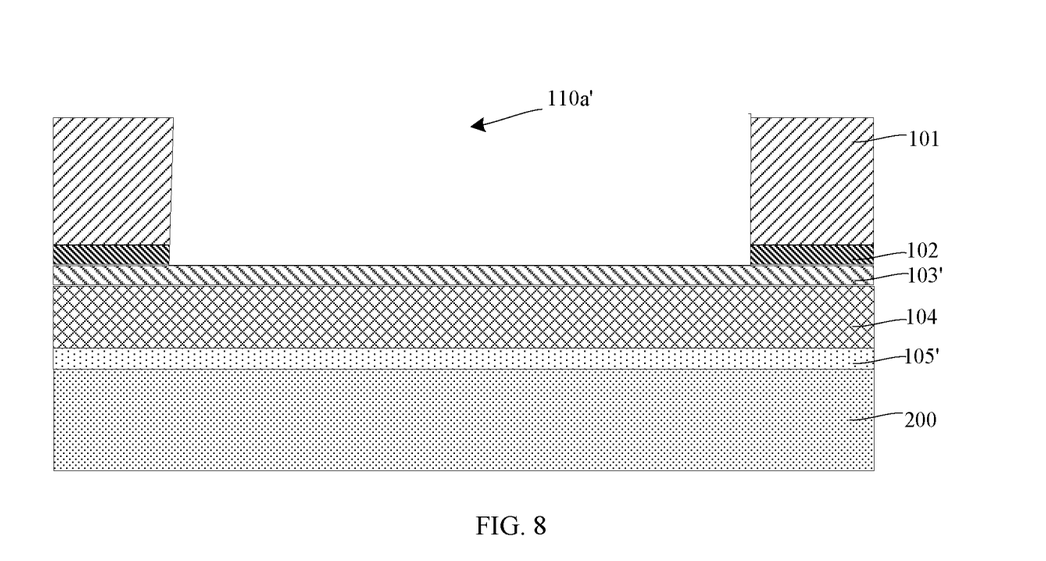
Figure 9:
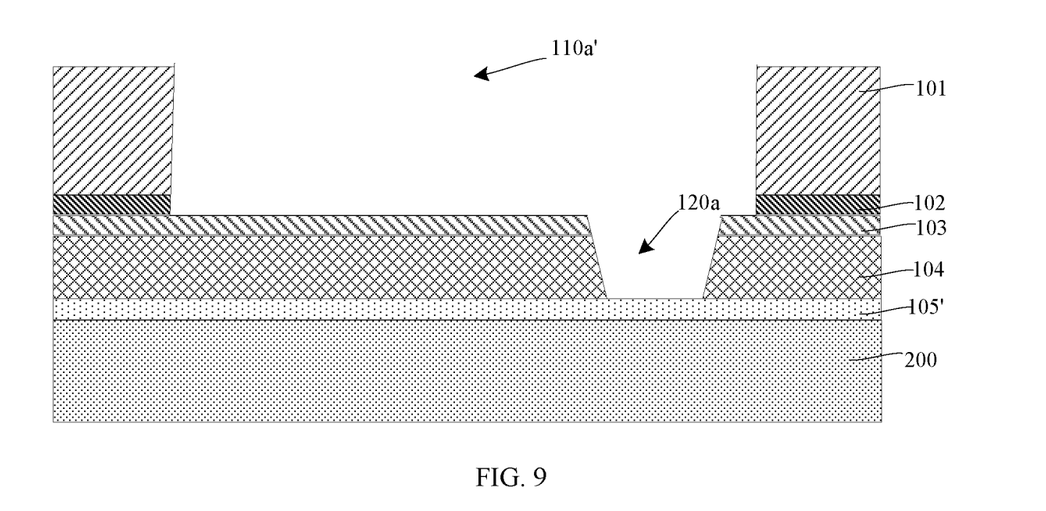

Referring to FIGS. 7-9, step S02 may be performed to form the support layer 101 over the first electrode layer 103', form a first opening 110a' in the support layer 101 to expose a portion of the first electrode layer 103', etch the first electrode layer 103' and the piezoelectric layer 104 to form the first trench 120a which is connected to the opening 110a'. For example, the support layer 101 may be first formed on the first electrode layer 103' by a chemical deposition process, as shown in FIG. 7. The material of the support layer 101 may be, for example, one or a combination of silicon dioxide ($SiO_2$), silicon nitride ($Si_3N_4$), aluminum oxide ($Al_2O_3$) and aluminum nitride (AlN). The material of the support layer 101 in one embodiment may be silicon dioxide ($SiO_2$). Then, the support layer 101 may be etched by an etching process to form the first opening 110a' to expose the portion of the first electrode layer 103', as shown in FIG. 8. The etching process may be a wet etching process or a dry etching process; and the dry etching process may be preferably used. The dry etching process may include, but may not be limited to, reactive ion etching (RIE), ion beam etching, plasma etching, or laser cutting. The depth and shape of the opening 110a' may depend on the depth and shape of the first cavity required by the bulk acoustic resonator to be fabricated, that is, the depth of the opening 110a' may be determined by the formed thickness of the support layer 101. The shape of the bottom surface of the opening 110a' may be a rectangle or a polygon other than a rectangle, such as a pentagon, a hexagon, an octagon, and the like, and may also be a circle or an ellipse. In other embodiments of the present disclosure, the longitudinal cross-sectional shape of the opening 110a' may also be a spherical crown with a wide top and a narrow bottom, that is, the longitudinal cross-section may be U-shaped.

In one embodiment, before forming the support layer 101, the etch stop layer 102 may be further formed on the first electrode layer 103', and the material of the etch stop layer 102 may include, but may not be limited to, silicon nitride ($Si_3N_4$) and silicon oxynitride (SiON). The etch stop layer 102 has a lower etch rate compared with the support layer 101 formed subsequently, which may prevent over-etching when the support layer 101 is subsequently etched to form the first opening 110a' and protect the surface of the first electrode layer 103' under the etch stop layer 102 from being damaged.

Next, the first electrode layer 103' and the piezoelectric layer 104 may be etched to form the first trench 120a in the opening 110a'. As shown in FIG. 9, the sidewall of the first trench 120a may be inclined or vertical. In one embodiment, the sidewall of the first trench 120a and the plane where the second electrode 105 is located may form an obtuse angle (the shape of the longitudinal section (the cross section along the thickness direction of the substrate) of the first trench 120a is an inverted trapezoid). The projection of the first trench 120a on the plane where the piezoelectric layer 104 is located may be a half-ring or a half-ring-like polygon. In other embodiments, referring to FIG. 2C, a plurality of discrete first trenches 120a may also be formed, such that the projections of the plurality of first trenches 120a on the plane where the piezoelectric layer 104 is located may be a discontinuous semicircular ring. The first trench may be etched using a dry etching process. The dry etching process may include, but may not be limited to, reactive ion etching (RIE), ion beam etching, plasma etching, or laser cutting. The angle α between the sidewall of the etched first trench 120a and the plane where the second electrode 105 is located may be an obtuse angle, where $90 < \alpha < 160$.

Next, the first electrode layer 103' may be patterned to form the first electrode 103. For example, a photoresist may be applied to the surface of the first electrode layer 103' to form a photoresist layer; the photoresist layer may be patterned by photolithography through a first mask preset with the first electrode pattern; and using the patterned photoresist layer as a mask, the first electrode layer 103' may be etched through a dry etching process. The first electrode 103 formed by the etching process may include the first electrode adjoining region 1031 and the first electrode resonance region 1032; the first electrode resonance region 1032 may overlap the active resonance region 001; and the formed first electrode adjoining region 1031 may connect the first electrode resonance region 1032 to the support layer surrounding the cavity. In one embodiment, referring to FIG. 2C, the first electrode adjoining region 1031 may be a bridge structure. In other embodiments, the first electrode adjoining region 1031 may also be a planar structure or a multi-bridge structure connecting multiple sides of the support layer 101. It should be noted that when patterning the first electrode layer, all regions of the first electrode layer 103' other than the first electrode adjoining region 1031 and the first electrode resonance region 1032 may be etched; and the first electrode 103 may be electrically isolated from other regions in the first electrode layer 103'. For example, by etching the boundary of the pattern of the first electrode 103 defined in the first electrode layer 103' (the region outside the boundary of the first electrode defined by the first trench 120a), the first electrode layer 103' may be passed though, and a gap with a certain line width along the boundary of the pattern of the first electrode 103 may be etched. Finally, the first electrode 103 may be completely separated from the first electrode layer 103', and the other regions in the first electrode layer 103' may still be retained to achieve electrical separation.

Figure 10:
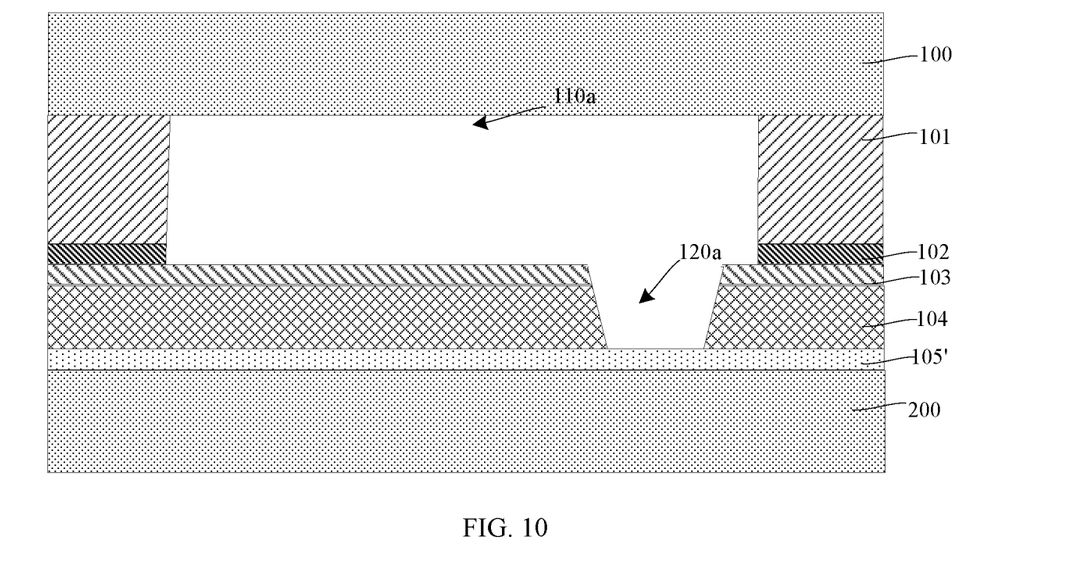

Referring to FIG. 10, step S03 may be performed to bond the first substrate 100 with the support layer 101. The first substrate 100 and the first electrode 103 may form the cavity 110a at the opening 110a' of the support layer 101. In one embodiment, the first substrate 100 may be any suitable substrate known to those skilled in the art. For example, the first substrate 100 may be made of a material including at least one of the materials mentioned below: silicon (Si), germanium (Ge), silicon germanium (SiGe), silicon carbon (SiC), silicon germanium (SiGeC), indium arsenide (InAs), Gallium arsenide (GaAs), indium phosphide (InP) or other III/V compound semiconductors; a multilayer-structure composed of such semiconductors; silicon-on-insulator (SOI), silicon-on-insulator (SSOI), silicon-germanium-on-insulator (S—SiGeOI), silicon germanium-on-insulator (SiGeOI), and germanium-on-insulator (GeOI); and a double side polished wafer (DSP), a ceramic substrate such as alumina, a quartz or glass substrate, and/or the combination thereof. The bonding of the first substrate 100 and the support layer 101 may be achieved by a thermocompression bonding process or a dry film bonding process. After the bonding process is completed, the above-mentioned bonded film bulk acoustic resonator may be turned over for subsequent steps.

In other embodiments of the present disclosure, the method for forming the first trench 120a and the cavity 110a may further include:

providing the first substrate 100, forming the support layer 101 on the first substrate 100, etching the support layer 101 to expose a portion of the first substrate 100, and forming the opening 110a' in the support layer 101; etching the first electrode 103 and the piezoelectric layer 104 to form the first trench 120a; and bonding the support layer 101 formed with the opening 110a' with the piezoelectric stacked layer 120 formed with the first trench 120a to form the cavity 110a.

The process steps of forming the first trench 120a and the support layer 101 with the opening 110a' are not limited in sequence, and those skilled in the art may implement the steps according to actual process conditions.

Figure 11:
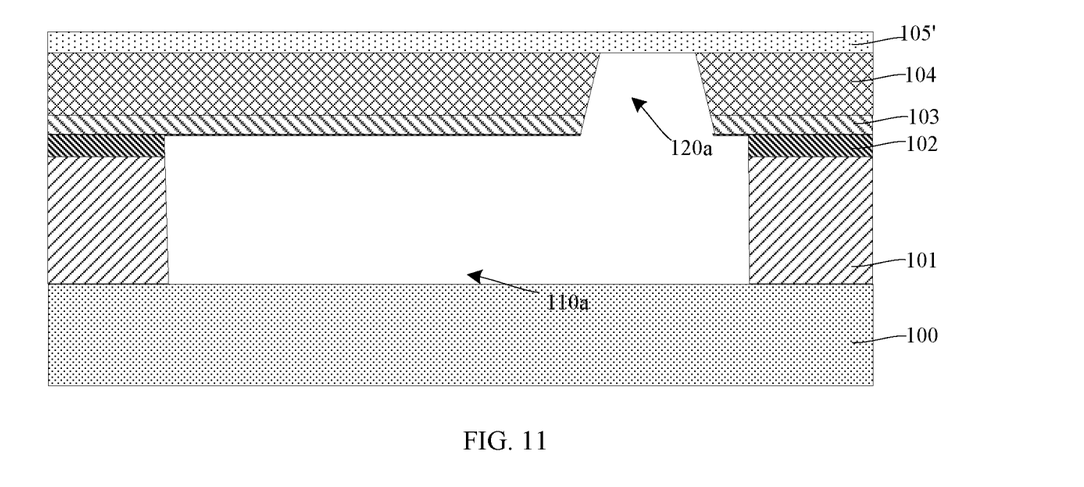

Referring to FIG. 11, step S04 may be performed to remove the second substrate 200. In one embodiment, the second substrate 200 may be peeled off by the erosion of the isolation layer. In other embodiments of the present disclosure, other methods such as etching or mechanical polishing, and the like may be used to remove the second substrate 200.

Figure 12:
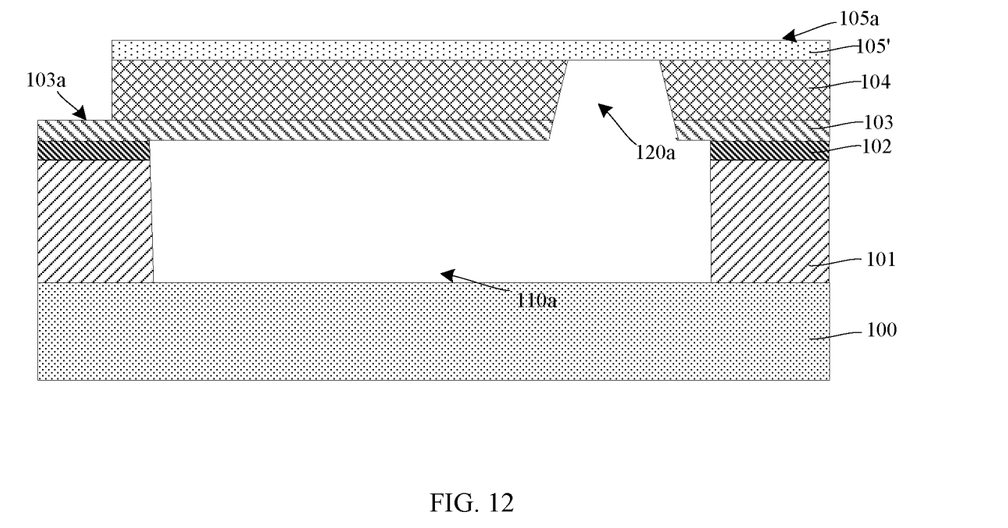
Figure 13:
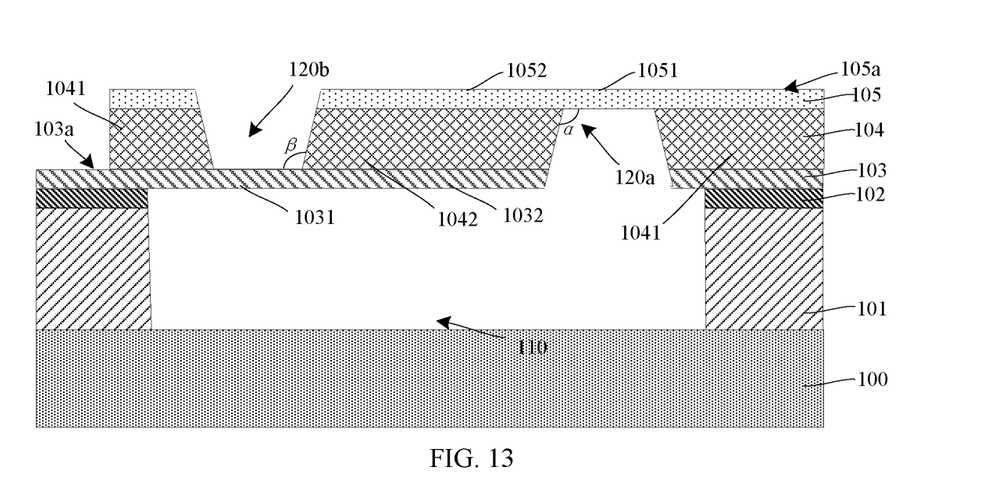

Referring to FIGS. 12-13, step S05 may be performed to etch the second electrode layer 105' and the piezoelectric layer 104 to form the second trench 120b. The projections of the first trench 120a and the second trench 120b on the plane where the piezoelectric layer 104 is located may form a closed or nearly closed shape.

For example, the second electrode layer 105 and the piezoelectric layer 104 may be etched to form the second trench 120b. As shown in FIG. 13, the sidewall of the second trench 120b may be inclined or vertical. In one embodiment, the sidewall of the second trench 120b and the plane where the first electrode layer 103' is located may form an obtuse angle (the shape of the longitudinal section (the cross section along the thickness direction of the substrate) of the second trench 120b is an inverted trapezoid). The projection of the second 120b on the plane where the piezoelectric layer 104 is located may be a half-ring or half-ring-like polygon. In other embodiments, referring to FIG. 2C, a plurality of discontinuous second trenches 120b may also be formed, such that the projections of the plurality of second trenches 120b on the plane where the piezoelectric layer 104 is located may be a discontinuous semicircular ring. The second trench may be etched using a dry etching process. The dry etching process may include, but may not be limited to, reactive ion etching (RIE), ion beam etching, plasma etching, or laser cutting. The angle α between the sidewall of the etched second trench 120b and the plane where the first electrode 103 is located may be an obtuse angle, where 90<α<160.

Next, the second electrode layer 105' may be patterned to form the first electrode 105. For example, a photoresist may be applied to the surface of the second electrode layer 105' to form a photoresist layer; the photoresist layer may be patterned by photolithography through a first mask preset with the first electrode pattern; and using the patterned photoresist layer as a mask, the second electrode layer 105' may be etched through a dry etching process. The second electrode 105 formed by the etching process may include the second electrode adjoining region 1051 and the second electrode resonance region 1052; the second electrode resonance region 1052 may overlap the active resonance region 001; and the formed second electrode adjoining region 1051 may connect the second electrode resonance region 1052 to the piezoelectric stacked layer on the periphery of the cavity. In one embodiment, referring to FIG. 2A, the second electrode adjoining region 1051 may be a bridge structure. In other embodiments, the second electrode adjoining region 1051 may also be a planar structure or a multi-bridge structure with one end connected to the second electrode adjoining region 1051 and the other end connected to the edge of the piezoelectric stacked layer on the periphery of the cavity. The second electrode adjoining region 1051 and the first electrode adjoining region 1031 may not overlap above the cavity, thereby reducing the parasitic resonance in the non-active resonance region (i.e., the inactive resonance region 002) above the cavity. It should be noted that when patterning the second electrode layer, all regions of the second electrode layer 105' other than the first electrode adjoining region 1031 and the first electrode resonance region 1032 may be etched; and the second electrode 105 may be electrically isolated from other regions in the second electrode layer 105'. For example, by etching the boundary of the pattern of the second electrode 105 defined in the second electrode layer 105' (the region outside the boundary of the second electrode defined by the second trench 120b), the second electrode layer 105' may be passed though, and a gap with a certain line width along the boundary of the pattern of the second electrode 105 may be etched. Finally, the second electrode 105 may be completely separated from the second electrode layer 105', and the other regions in the second electrode layer 105' may still be retained to achieve electrical separation.

In addition, the cross sections of the first trench 120a and the second trench 120b along the line AA' in FIG. 2A may be trapezoidal or trapezoid-like (that is, a and p are obtuse angles). In one embodiment, the shape (the active resonance region 001) enclosed by the projections of the first trench 120a and the second trench 120b on the plane where the piezoelectric layer 104 is located may be an exactly connected pentagon; and the polygon may not contain any pair of relatively parallel straight-line segments. In other embodiments of the present disclosure, the shape formed by the projections of the first trench 120a and the second trench 120b on the plane where the piezoelectric layer 104 is located may also be a nearly closed pentagon with gaps (a first junction gap 150a' and a second junction gap 150b') at two junctions, as shown in FIG. 2B. In one embodiment, the second soldering pad 107b may be formed on the edge region 105a. In addition, during the process of etching the second electrode 105 and the piezoelectric layer 104 to form the second trench 120b, a portion of the second electrode 105 (the edge region 105a) and the piezoelectric layer 104 may be etched to expose the edge region 103a on the side of the first electrode 103, thereby facilitating the signal input/output of the first electrode 103. For example, the first soldering pad 107a may be formed on the edge region 103a.

The present disclosure provides the film bulk acoustic resonator and its manufacturing method, the filter and the radio frequency communication system. The first trench and the second trench may be disposed in the piezoelectric stack layer of the film bulk acoustic resonator provided by the present disclosure. The projections of the first trench and the second trench on the plane where the piezoelectric layer is located may enclose the active resonance region of the film bulk acoustic resonator. In the present disclosure, the first trench and the second trench may effectively block the propagation of transverse waves in the inactive resonance region, which may improve the acoustic wave loss and the quality factor of the film bulk acoustic resonator, thereby improving the performance of the device. Meanwhile, the patterned first electrode adjoining region and the second electrode adjoining region may not overlap above the cavity, which effectively avoids the parasitic resonance of the inactive resonance region of the piezoelectric stacked layer, thereby further improving the quality factor of the film bulk acoustic resonator.

From the above-mentioned embodiments, it can be seen that the technical solutions provided by the present disclosure may achieve at least the following beneficial effects.

In the film bulk acoustic resonator provided by the present disclosure, at least two trenches may be disposed/distributed at the junction of the active resonance region and the inactive resonance region to define the range of the active resonance region. The trenches may include the first trench and the second trench; the second trench may pass through the second electrode and the piezoelectric layer; and the first trench may pass through the first electrode and the piezoelectric layer and be connected to the cavity. The first trench and the second trench may effectively block the propagation of transverse waves in the inactive resonance region, which may improve the acoustic wave loss and the quality factor of the film bulk acoustic resonator, thereby further improving the performance of the device. Furthermore, the first electrode adjoining region and the second electrode adjoining region after the patterning process may not overlap above the cavity, which effectively avoids the parasitic resonance of the inactive resonance region of the piezoelectric stacked layer, thereby further improving the quality factor of the film bulk acoustic resonator.

It should be noted that each embodiment in present specification may be described in a related manner, and the same or similar parts between the various embodiments may be referred to each other. Each embodiment may focus on the differences from other embodiments. Particularly, as for the structural embodiments, since it is basically similar to the method embodiments, the description may be relatively simple, and related parts may refer to the partial description of the method embodiments.

The above-mentioned description is merely for the description of the preferred embodiments of the present disclosure, and it not intended to limit the scope of the present disclosure. Any changes and modifications based on the above-mentioned embodiments made by those skilled in the art are all within the scope of the present disclosure.

What is claimed is:
1. A film bulk acoustic resonator, comprising:
a first substrate and a support layer disposed on the first substrate, wherein a cavity is formed in the support layer;

a piezoelectric stacked layer covering the cavity, wherein the piezoelectric stacked layer includes a first electrode, a piezoelectric layer, and a second electrode which are sequentially disposed on the support layer, and the piezoelectric stacked layer includes an active resonance region above a center of the cavity and an inactive resonance region surrounding the active resonance region; and at least two trenches, arranged at a junction of the active resonance region and the inactive resonance region to define a range of the active resonance region, wherein the at least two trenches include a first trench and a second trench; the second trench passes through the second electrode layer and the piezoelectric layer; and the first trench passes the first electrode and the piezoelectric layer and is connected to the cavity, wherein:

an angle between a sidewall of the first trench and a plane of the second electrode is an obtuse angle, and an angle between a sidewall of the second trench and a plane of the first electrode is an obtuse angle.

2. The film bulk acoustic resonator according to claim 1, wherein:

the piezoelectric material layer is made of a material including aluminum nitride, zinc oxide, lead zirconate titanate, lithium niobate, quartz, potassium niobate, or a combination thereof.

3. The film bulk acoustic resonator according to claim 1, wherein:

the support layer is connected to the first substrate by a bonding process.

4. The film bulk acoustic resonator according to claim 3, wherein:

the bonding process includes a thermocompression bonding process or a dry film bonding process.

5. The film bulk acoustic resonator according to claim 1, wherein:

a projection of the active resonance region on a plane of the piezoelectric layer is a polygon, and any two sides of the polygon are not in parallel with each other.

6. The film bulk acoustic resonator according to claim 1, wherein:

the first electrode includes a first electrode adjoining region and a first electrode resonance region; the first electrode resonance region overlaps the active resonance region;

and the first electrode adjoining region is connected to each of the first electrode resonance region and the support layer.

7. The film bulk acoustic resonator according to claim 6, wherein:

the second electrode includes a second electrode adjoining region and a second electrode resonance region; the second electrode resonance region overlaps the active resonance region; the second electrode adjoining region is connected to each of the second electrode resonance region and the piezoelectric stacked layer on a periphery of the cavity; and projections of the second electrode adjoining region and the first electrode adjoining region on a plane of the piezoelectric layer are not overlapped with each other.

8. The film bulk acoustic resonator according to claim 1, wherein:

the support layer is made of a material including silicon oxide, silicon nitride, silicon oxynitride, silicon carbonitride, or a combination thereof.

9. A filter, comprising
at least one film bulk acoustic resonator each comprising:

a first substrate and a support layer disposed on the first substrate, wherein a cavity is formed in the support layer;

a piezoelectric stacked layer covering the cavity, wherein the piezoelectric stacked layer includes a first electrode, a piezoelectric layer, and a second electrode which are sequentially disposed on the support layer, and the piezoelectric stacked layer includes an active resonance region above a center of the cavity and an inactive resonance region surrounding the active resonance region; and at least two trenches, arranged at a junction of the active resonance region and the inactive resonance region to define a range of the active resonance region, wherein the at least two trenches include a first trench and a second trench; the second trench passes through the second electrode layer and the piezoelectric layer; and the first trench passes the first electrode and the piezoelectric layer and is connected to the cavity, wherein:

an angle between a sidewall of the first trench and a plane of the second electrode is an obtuse angle, and an angle between a sidewall of the second trench and a plane of the first electrode is an obtuse angle.

10. A radio frequency communication system, wherein the radio frequency communication system includes at least one filter according to claim 9.

11. A method for fabricating a film bulk acoustic resonator, comprising:

providing a second substrate and forming a piezoelectric stacked layer-structure on the second substrate, wherein the piezoelectric stacked layer-structure includes a second electrode layer, a piezoelectric layer, and a first electrode layer which are sequentially formed on the second substrate;

forming a support layer on the first electrode layer, wherein an opening is formed in the support layer, exposing a portion of the first electrode layer;

etching the first electrode layer and the piezoelectric layer to form at least one first trench connected to the opening;

providing a first substrate, and bonding the first substrate with the support layer to seal the opening, forming a cavity;

removing the second substrate; and etching the second electrode layer and the piezoelectric layer to form at least one second trench, wherein projections of the first trench and the second trench on a plane of the piezoelectric layer enclose an active resonance region, wherein:

an angle between a sidewall of the first trench and a plane of the second electrode layer is an obtuse angle, and an angle between a sidewall of the second trench and a plane of the first electrode layer is an obtuse angle.

12. The method according to claim 11, wherein bonding the first substrate with the support layer to seal the opening includes:

using a thermocompression bonding process or a dry film bonding process to bond the first substrate with the support layer.

13. The method according to claim 11, wherein etching the first electrode layer and the piezoelectric layer to form the at least one first trench includes:

using a first patterned mask, etching the first electrode layer and the piezoelectric layer to form the at least one first trench.

14. The method according to claim 11, wherein etching the first electrode layer and the piezoelectric layer to form the at least one first trench further includes:

patterning the first electrode layer to form a first electrode, wherein the first electrode includes a first electrode adjoining region and a first electrode resonance region; the first electrode resonance region overlaps the active resonance region; and the first electrode adjoining region is connected to each of the first electrode resonance region and the support layer.

15. The method according to claim 14, wherein etching the second electrode layer and the piezoelectric layer to form the at least one second trench includes:

using a second patterned mask, etching the second electrode layer and the piezoelectric layer to form the at least one second trench.

16. The method according to claim 15, wherein etching the second electrode layer and the piezoelectric layer to form the at least one second trench further includes:

patterning the second electrode layer to form a second electrode, wherein the second electrode includes a second electrode adjoining region and a second electrode resonance region; the second electrode resonance region overlaps the active resonance region; the second electrode adjoining region is connected to each of the second electrode resonance region and the piezoelectric stacked layer on a periphery of the cavity; and projections of the second electrode adjoining region and the first electrode adjoining region on the plane of the piezoelectric layer are not overlapped with each other.

17. The method according to claim 11, wherein a shape of the active resonance region is a polygon, and any two sides of the polygon are not in parallel with each other.

18. The method according to claim 11, wherein: the second substrate is removed by mechanical polishing, etching, erosion, or a combination thereof.

* * * * *